United States Patent
Roquiny et al.

(10) Patent No.: US 10,562,813 B2
(45) Date of Patent: Feb. 18, 2020

(54) SOLAR CONTROL GLAZING

(71) Applicants: AGC GLASS EUROPE, Louvain-la-Neuve (BE); AGC FLAT GLASS NORTH AMERICA, INC., Alpharetta, GA (US)

(72) Inventors: Philippe Roquiny, Abingdon, VA (US); Oliver Kappertz, Goettingen (DE); Joerg Moennekes, Hoexter (DE); Yuping Lin, Kingsport, TN (US); Stijn Mahieu, Lovendegem (BE); Anne-Christine Baudouin, Louvain-la-Neuve (BE)

(73) Assignees: AGC GLASS EUROPE, Louvain-la-Neuve (BE); AGC FLAT GLASS NORTH AMERICA, INC., Alpharetta, GA (US)

( * ) Notice: Subject to any disclaimer, the term of this patent is extended or adjusted under 35 U.S.C. 154(b) by 0 days.

(21) Appl. No.: 16/381,623

(22) Filed: Apr. 11, 2019

(65) Prior Publication Data

US 2019/0233328 A1  Aug. 1, 2019

Related U.S. Application Data

(62) Division of application No. 14/894,420, filed as application No. PCT/EP2014/061115 on May 28, 2014, now Pat. No. 10,358,385.

(30) Foreign Application Priority Data

| May 30, 2013 | (BE) | ................................ 2013/0384 |
| May 30, 2013 | (BE) | ................................ 2013/0385 |
| May 30, 2013 | (BE) | ................................ 2013/0386 |
| Dec. 13, 2013 | (EP) | ................................ 13197207 |

(51) Int. Cl.
  *B32B 15/04* (2006.01)
  *B32B 17/06* (2006.01)
  *C03C 17/36* (2006.01)
  *C23C 14/35* (2006.01)

(52) U.S. Cl.
  CPC ........ *C03C 17/3681* (2013.01); *C03C 17/366* (2013.01); *C03C 17/3618* (2013.01); *C03C 17/3639* (2013.01); *C03C 17/3642* (2013.01); *C03C 17/3644* (2013.01); *C23C 14/35* (2013.01); *C03C 2218/153* (2013.01); *C03C 2218/156* (2013.01)

(58) Field of Classification Search
  USPC ...... 428/428, 432, 434, 701, 702; 427/248.1
  See application file for complete search history.

(56) References Cited

U.S. PATENT DOCUMENTS

| 6,589,658 | B1 | 7/2003 | Stachowiak |
| 2008/0226887 | A1 | 9/2008 | Chang |
| 2011/0268941 | A1 | 11/2011 | Fischer et al. |
| 2012/0219821 | A1* | 8/2012 | Frank ..................... C03C 17/36 428/630 |

FOREIGN PATENT DOCUMENTS

| FR | 2 781 789 | 2/2000 |
| FR | 2 936 510 | 4/2010 |
| WO | 2011 120595 | 10/2011 |

OTHER PUBLICATIONS

International Search Report dated Dec. 15, 2014 in PCT/EP2014/061115 filed May 28, 2014.

* cited by examiner

*Primary Examiner* — Lauren R Colgan
(74) *Attorney, Agent, or Firm* — Oblon, McClelland, Maier & Neustadt, L.L.P.

(57) ABSTRACT

A heat treatable solar control glazing showing low-emissivity properties, and possibly also anti-solar properties, and methods to manufacture such a glazing. The glazing comprises a transparent substrate coated with a stack of thin layers comprising n functional layer(s) reflecting infrared radiation and n+1 dielectric layers, with n≥1, each functional layer being surrounded by dielectric layers. At least one dielectric layer above a functional layer comprises a layer consisting essentially of silicon oxide deposited by PECVD, and the stack comprises a barrier layer based on zinc oxide above and in direct contact with any functional layer which has a silicon oxide layer in the dielectric layer directly above it.

20 Claims, No Drawings

SOLAR CONTROL GLAZING

This application is a divisional of U.S. application Ser. No. 14/894,420, filed Nov. 27, 2015, now U.S. Pat. No. 10,358,385, which is a 371 application of PCT/EP2014/061115 filed May 28, 2014, expired, and claims priority of Belgium application number 2013/0384 filed May 30, 2013; Belgium application 2013/0385, filed May 30, 2013, and Belgium application 2013/0386 filed May 30, 2013 and claims benefit from European Application 13197207.7 filed Dec. 13, 2013. The contents of each of these applications are incorporated herein by reference.

The present invention relates to solar control glazing showing low-emissivity properties, and possibly also anti-solar properties, which can be incorporated into glazing for building or automotive applications.

Such glazing generally comprise a transparent substrate, e.g. a glass sheet, coated with a stack of thin layers comprising n functional layer(s) based on a material reflecting the infrared radiation and n+1 dielectric layers, with $n \geq 1$, each functional layer being surrounded by dielectric layers. The functional layer is generally a layer of silver of a few nanometres thickness, whilst the dielectric layers are transparent and traditionally made of metallic oxides and/or nitrides. These various layers are commonly coated by vacuum coating techniques of the type magnetron sputtering.

Low-emissivity glazing have the property of reflecting infrared radiation for example emitted by the interior of building, thereby limiting heat losses. Often, at the same time, it is requested to have a luminous transmission (LT) as high as possible. These two requests, i.e. low emissivity and high transmission, generally lead to opposed solutions in terms of structure. Therefore, it is necessary to make difficult compromises. Glazing having solar protection properties allows reducing the risk of excessive overheating due to sunshine, for example of a closed space having large vitreous surfaces, thereby reducing the air-conditioning requirements in summertime. In that case, the glazing should transmit a total solar radiation energy as low as possible, i.e. have a solar factor (SF or g) as low as possible. It is however highly desirable that a certain level of luminous transmission be guaranteed to ensure a sufficient illumination of the interior of the building. These somehow opposed requirements are reflected by the wish to obtain a glazing having a high selectivity (S), defined by the ration LT/SF. Having furthermore low emissivity properties, such glazing improve the thermal insulation of large glass surfaces and reduce energy losses and heating costs in cold periods.

Such glazing are generally assembled in multiple glazing units like double or triple glazing or laminated glazing, wherein the coated glass sheet is associated with one or more other glass sheet(s), coated or not. The coating stack is positioned in contact with the space between two sheets of glass, in the case of multiple glazing, or in contact with the adhesive layer, in the case of laminated glazing.

In some case, it is necessary to mechanically reinforce the glazing by a thermal treatment of the glass sheet to improve its resistance to mechanical constraints. It can also be necessary to bend the glass sheet at high temperature for specific applications. In the entire process of manufacturing glazing, it may be advantageous to heat treat glass sheets which are already coated rather than coating already heat-treated glass sheets. These operations are done at relatively high temperature, under which the functional layers reflecting the infrared radiation, for example silver-based layers, tend to deteriorate and lose their optical properties and their properties vis-à-vis infrared radiation. These thermal treatments comprise heating the glass sheet to a temperature of at least 560° C. in air, for example between 560° C. and 700° C., in particular around 640° C. to 670° C., during around 3, 4, 6, 8, 10, 12 or even 15 minutes according to the heat-treatment type and the thickness of the glass sheet. The treatment may comprise a rapid cooling step after the heating step, to introduce stresses difference between the surface and the core of the glass so that in case of impact, the so-called tempered glass sheet will break safely in small pieces. If the cooling step is less strong, the glass will then simply be heat-strengthened and in any case offer a better mechanical resistance.

In the case where the coated glass sheet necessitates a thermal treatment, care must be taken to ensure that the coating stack can withstand a heat-treatment of the type tempering or bending without losing the optical and/or energetical properties for which it has been manufactured. Such stacks are sometimes called "heat-treatable" or "temperable". Dielectric materials should be selected that do resist to high temperature without harmful structural modification: for example, zinc-tin mixed oxide, silicon nitride and aluminium nitride. Moreover functional silver-based layers should not oxidise during heat-treatment, for example by ensuring that barrier layers are present which, during the treatment, oxidise themselves by capturing free oxygen or block such oxygen migrating towards silver.

The coating stacks should simultaneously satisfy other conditions, like chemical and mechanical resistance and aesthetics (in particular colours in reflection and transmission, the market generally requesting a colour as neutral as possible). The difficulty is to combine all these conditions, optionally with the ability to undergo a heat treatment, to the "basic" conditions of high luminous transmission, low emissivity, low solar factor. One additional difficulty comes from the manufacturing processes used to produce such glazing. The coating conditions, inter alia the deposition speed, are dependent on the nature of the envisaged materials. For an economically acceptable industrial production, the speed must be sufficient. It depends on multiple factors which guarantee the process stability over the whole production time, on the whole surface of the glass sheet and without defects in the coating.

Numerous solutions have been proposed to fulfil these various requirements, but no solution presently offers a glazing really satisfying at best all these requests.

EP803481 discloses heat-treatable low-emissivity single-silver and double-silver coating stacks of the type GL/D1/Ag/Ti/D2 and GL/D1/Ag/Ti/D2/Ag/Ti/D3 (where GL means glass and D means dielectric), wherein materials used in dielectrics comprise zinc-tin mixed oxide, zinc oxide and titanium oxide. Alternatively, EP1140721 describes heat treatable low-emissivity coating stacks of the type GL/D/Ag/AZO/D2 (where AZO means aluminium-doped zinc oxide), wherein materials used in dielectrics also comprise zinc-tin mixed oxide, zinc oxide and titanium oxide.

However we have noted that stacks according to EP803481 suffered from some defects in terms of mechanical durability and that stacks according to EP1140721 showed haze and unacceptable spots after heat-treatment (see our comparative example 1 hereunder).

In our process of improving such traditional prior art coating stacks with a view towards the aim of our invention, we came across WO2007/080428 which already noted the same drawback of EP1140721 stacks and tried to solve it with a first dielectric comprising at least 3 layers, in order from the glass substrate: aluminium (oxi)nitride/tin oxide or zinc-tin mixed oxide/zinc oxide, and a second dielectric comprising at least two layers: a main zinc-tin mixed oxide layer and a thin outermost protection layer of less than 10 nm thickness. However, we have noted that coating stacks according to WO2007/080428 also show a non-negligible drawback: their chemical durability before any heat-treatment is not sufficient (see our comparative examples 2 and 3 hereunder). However coating according to the present invention must be usable without subsequent heat treatment or stored before undergoing a thermal treatment, therefore their resistance to ageing before heat treatment should be sufficient.

Furthermore the simple addition of a thin protective topcoat known to improve mechanical durability to such traditional prior art coating stacks has proven not to be sufficient to reach the level of performances aimed by the present invention.

EP506507 and WO2012/127162 both disclose single-silver infrared reflecting films ending with a SiO2 layer, respectively of around 25 nm and 40 to 120 nm. The stacks of EP506507 are said to be heat-treatable, whilst WO2012/127162 does not mention such feature. Both documents describe a barrier layer above and in contact with the silver layer which is metallic and a SiO2 layer deposited by magnetron sputtering.

On the other hand, it is known, for example from WO2012/160145, to deposit SiO2 coatings by plasma enhanced chemical vapour deposition ("PECVD"), to increase the efficiency of SiO2 deposition compared to SiO2 by sputtering. But we found that simply replacing sputtered-SiO2 by PECVD-SiO2 in such type of coating stacks caused a lot of difficulties. In particular we could not reach at the same time a low haze value and a good resistance to abrasion (see our comparative examples 4 to 9 hereunder).

The aim of the invention is therefore to seek to develop a new type of coating stack with solar control properties which is efficient in terms of optical and energetical properties, which maintains these properties after a possible heat-treatment, which is chemically and mechanically resistant, which is aesthetically pleasant (neutral colour and low haze) and which is practical and efficient to manufacture.

In the present invention, the following conventions are used:

The luminous transmission (LT) is the percentage of incident luminous flux, of Illuminant D65/2°, transmitted by the glazing.

The luminous reflection (LR) is the percentage of incident luminous flux, of Illuminant D65/2°, reflected by the glazing. It can be measured on coating side (LRc) or substrate side (LRg).

The energetic transmission (ET) is the percentage of incident energetic radiation transmitted by the glazing calculated according to standard EN410.

The energetic reflection (ER) is the percentage of incident energetic radiation reflected by the glazing calculated according to standard EN410. It can be measured on coating side (ERc) or substrate side (ERg).

The solar factor (SF or g) is the percentage of incident energetic radiation which is partly directly transmitted by the glazing and partly absorbed by it, then radiated in the direction opposite to the energetical source in relation to the glazing. It is herein calculated according to standard EN410.

U value and emissivity (ε or E) are calculated according to standards EN673 and ISO 10292.

CIELAB 1976 values ($L^*a^*b^*$) are used to define colours. They are measured with Illuminant D65/10°.

$\Delta E^* = \sqrt{(\Delta L^*)^2 + (\Delta a^*)^2 + (\Delta b^*)^2}$ represents the tint variation during the heat treatment, i.e. the difference between before and after heat treatment colours.

Sheet resistance ($R^2$ or Rs), expressed in ohms per square (Ω/□), measures the electrical resistance of thin films.

When values are said to be "comprised between a and b", they may also be equal to a or b.

The positioning of the coating stack in a multiple glazing is given in accordance with the standard successive numbering of glazing faces, face 1 being outside of the building or the vehicle, and face 4 (in a double-glazing) or face 6 (in a triple-glazing) being inside.

According to one of its aspects, the present invention provides a glazing as defined by claim 1. Dependent claims define preferred and/or alternative aspects of the invention.

The invention provides a glazing having a transparent substrate coated with a stack of thin layers comprising n functional layer(s) reflecting infrared radiation and n+1 dielectric layers, with n≥1, each functional layer being surrounded by dielectric layers. It is characterised by the fact that at least one dielectric layer above a functional layer comprises a layer consisting essentially of silicon oxide and by the fact that the stack comprises a barrier layer based on zinc oxide above and in direct contact with any functional layer which has a silicon oxide layer in the dielectric layer directly above it.

For the sake of clarity, when using terms like below, above, lower, upper, first or last herein, it is always in the context of a sequence of layers starting from the glass below, going upward, further away from the glass. Such sequences may comprise additional intermediate layers, in between the defined layers, except when a direct contact is specified.

Such glazing according to the invention, thanks to the specific combination of a silicon oxide layer and a zinc oxide based barrier has proven to offer the following advantages (stack of thin layers deposited on ordinary clear soda-lime float glass of 4 mm thickness, incorporated into a double glazing with another ordinary clear soda-lime float glass of 4 mm thickness, with a space in between of 15 mm, filled with 90% argon, the coating stack being in position 2):

a high luminous transmission, together with a low emissivity to limit heat losses (single functional layer configuration stack: LT≥73%, ε≤0.074 or ε≤0.044, preferably ε≤0.024; double functional layer configuration stack: LT>68%, ε≤0.038, preferably ε≤0.025);

a solar factor adjustment: low SF, but not too low, allowing the energetical part of the sun radiation to go through and take advantage of free energy in winter (e.g. single functional layer configuration stack: SF between 55% and 65%); or lower SF allowing to reduce the risk of excessive overheating due to sunshine (e.g. double functional layer configuration stack: SF<41%);

an insulation ability allowing to achieve a U value U≤1.3 W/(m²K) or U≤1.2 W/(m²K), preferably U≤1.1 W/(m²K) or U≤1.0 W/(m²K);

a neutral colour in transmission or reflection, in single or in multiple glazing, with preferred values in single glazing of:
in transmission: −6≤a*≤+5 −6≤b*≤+6
in reflection coating side: −6≤a*≤+6 −25≤b*≤10
in reflection substrate side: −5≤a*≤+3 −20≤b*≤+4 the possibility of being heat treated, the coating stack being able to undergo high temperatures, or being used without any heat treatment;

an aesthetical aspect without defect, with a very limited or non-existing haze without or after heat treatment, and the absence of unacceptable spots after heat treatment;

in some cases, the conservation of substantially unchanged optical and energetical properties after heat treatment, allowing the use of heat treated or non heat treated products beside each other ("self-matchability"): no or few colour modification in transmission and refection ($\Delta E^* \leq 8$, preferably $\leq 5$, more preferably $\leq 2$) and/or no or few change in the luminous and energetical transmission and reflection values ($\Delta = |$(value before heat treatment)−(value after heat treatment)$| \leq 5$, preferably $\leq 3$, more preferably $\leq 2$), in single and/or multiple glazing;

a sufficient chemical durability for a use without heat treatment or for the time interval before any heat treatment, in particular a result at the Cleveland test according to ISO 6270-1:1998 (exposure to humid vapours coming from a tank of deionized water heated to 50° C.) giving no discolouration visible at the naked eye after 1 day, preferably after 3 days;

a sufficient mechanical resistance, in particular resistance to abrasion, tested for example with the Wet Brush test (as explained hereinbelow), and giving a score of less than 3.

The inventors have indeed found that it was essential to have this combination of silicon oxide layer and zinc oxide based barrier to reach a compromise between high resistance to friction (scrubbing) and low haze.

The invention thus relates to a coating stack having n functional layer(s) reflecting infrared radiation and n+1 dielectric layers, with n≥1, each functional layer being surrounded by dielectric layers. Low-emissivity coatings generally include a single functional layer reflecting infrared radiation, whilst coatings having low-emissivity and anti-solar properties generally include two or three functional layers reflecting infrared radiation. Preferably the functional layer reflecting infrared radiation is a silver-based layer, consisting of silver or silver doped with for example palladium or gold, in a proportion of at most 5 Wt. %, preferably around 1 Wt. %. Incorporation of a low quantity of dopant in the silver-based layer may improve the chemical durability of the coating stack. Advantageously the functional layer has a thickness of at least 6 nm or at least 8 nm, preferably at least 10 nm; its thickness is preferably at most 22 nm or at most 20 nm, preferably at most 18 nm, or at most 16 nm. Such ranges of thickness allow to reach the sought low emissivity and/or anti-solar properties, whilst keeping the requested luminous transmission. In the case of a coating stack with two functional layers reflecting infrared radiation, it may be preferred that the thickness of the second functional layer, i.e. the one furthest away from the substrate, be slightly greater than the thickness of the first functional layer. As an example, the first functional layer may have a thickness between 8 and 18 nm and the second functional layer between 10 and 20 nm.

According to the invention, at least one dielectric layer above a functional layer comprises a layer consisting essentially of silicon oxide. This means, for example, that in a single functional layer configuration stack, a silicon oxide layer is present in the second, upper dielectric layer, and in a double functional layer configuration stack, a silicon oxide layer is present either in the second or third dielectric layer, or in each of the second and third dielectric layers. The layer consisting essentially of silicon oxide may include other materials, e.g. aluminium, as long as they do not affect the properties of the layer and of the coating stack. Generally such additional materials are present in the layer in a quantity of at most 10 at. %, preferably at most 5 at. %. The silicon oxide may be fully or partially oxidised, in a range going from SiO to $SiO_2$.

Advantageously, the layer consisting essentially of silicon oxide is obtained by plasma enhanced chemical vapour deposition (PECVD). PECVD is an efficient method to deposit silicon oxide, offering high deposition rate and allowing high speed deposition. However, PECVD may induce the presence of contaminants in the layer, like hydrogen- or carbon-based contaminants, which might possibly be at least partially oxidised. Preferably these should be as low as possible. It may be advantageous that the layer consisting essentially of silicon oxide has an extinction coefficient at a wavelength of 632 nm below 1E-4, a refractive index of at least 1.466 and a carbon content of at most 3 at. %. This may offer high thermal durability to the silicon oxide layer, and ensure that the coating stack incorporating such layer withstand at best a future heat treatment.

Preferably the layer consisting essentially of silicon oxide has a thickness of more than 10 nm. This minimum thickness may ensure that the silicon oxide layer acts as a barrier against diffusion of oxygen into the coating stack and helps for the thermal, mechanical and chemical stability of the coating. Preferably the layer consisting essentially of silicon oxide has a thickness of at most 125 nm, to avoid too much haze.

The stack according to the invention comprises a barrier layer based on zinc oxide above and in direct contact with any functional layer which has a silicon oxide layer in the dielectric layer directly above it. This zinc oxide based barrier layer comprises Zn in a quantity of at least 50 at. %, preferably at least 60 at. %, more preferably at least 70 at. %, still more preferably at least 80 at. %, of the metallic part of the oxide. Preferably the barrier layer consists of zinc oxide, optionally doped with aluminium. More preferably, the barrier layer is a layer of pure ZnO (denoted iZnO) or a layer of zinc oxide doped with aluminium (denoted AZO), in a proportion of at most 10 Wt. %, preferably around 2 Wt. %. Such barrier has been found to be essential to offer high mechanical resistance and low haze.

In a preferred embodiment, the stack comprises zinc oxide based barrier layers, preferably consisting of zinc oxide, optionally doped with aluminium, above and in direct contact with each functional layer. This may help further improve the overall stability of the coating in terms of resistance to heat treatment, mechanical and chemical resistance, whilst offering good visual aesthetics.

The zinc oxide based barrier layer(s) may have a thickness of at most 35 nm or at most 30 nm, preferably at most 25 nm or at most 20 nm, more preferably between 1 and 20 nm, between 2 and 18 nm or between 3 and 18 nm.

In preferred embodiments of the invention the first dielectric layer starting from the substrate (i.e. the lowest dielectric layer) comprises a layer of an oxide in direct contact with the substrate. Advantageously said layer of an oxide, which is in direct contact with the substrate, is a layer of an oxide of at least one material selected from Zn, Sn, Ti and Zr. Preferably it is a layer of mixed zinc-tin oxide in which the proportion zinc-tin is close to 50-50 Wt. %, for example respectively 52-48 Wt. % ($Zn_2SnO_4$). A mixed zinc-tin oxide may be advantageous as it shows a good deposition rate, a good durability, and it has less tendency to generate haze after heat treatment of the coating stack.

The layer of an oxide in direct contact with the substrate preferably has a thickness of at least 5 nm, 8 nm or 10 nm, more preferably at least 15 nm, still more preferably at least 20 nm. Such values of minimal thickness may allow, inter alia, to ensure the chemical durability of the product which is not heat treated, but also to ensure the resistance of the product to a heat treatment.

Advantageously, each dielectric layer under a functional layer (i.e. the first dielectric layer in a single functional layer configuration stack; the first and second dielectric layers in a double functional layer configuration stack; etc.) comprises a layer based on zinc oxide, directly in contact with said functional layer. Such a layer is sometimes called "seed layer" and helps for the growth of silver above it. Said layer based on zinc oxide may consist of zinc oxide or optionally be doped with other metals, for example aluminium, in a proportion of generally at most 10 Wt. %, preferably around 2 Wt. %. It preferably has a thickness of at most 15 nm, preferably between 1.5 and 10 nm, more preferably between 2 and 8 nm.

The dielectric layers may additionally comprise one or more other layers than those described hereinabove, as long as the direct contacts described as essential herein are respected: for example, one or more layers of dielectric material consisting of metal oxide, nitride or oxynitride, preferably ZnO, $TiO_2$, $SnO_2$, $Si_3N_4$, $ZrO_2$, zinc-tin mixed oxide or titanium-zirconium mixed oxide. In the case of a zinc-tin mixed oxide, it can show a zinc-tin proportion of around 50-50 Wt. %, or a zinc-tin proportion of around 90-10 Wt. %. The presence of a high refractive index material may further help to increase the luminous transmission of the glazing. It can be for example an oxide comprising one element selected from Ti, Nb et Zr, preferably a titanium-zirconium mixed oxide, for example in a weight ratio Ti/Zr of around 65/35.

The dielectric layers of single, double and triple functional layer configuration stacks may show the following optical thicknesses, expressed in nm:

|  | single functional layer stack | double functional layer stack | triple functional layer stack |
| --- | --- | --- | --- |
| first, lowest, dielectric layer (in contact with substrate) | from 20 to 160, preferably 30 to 130, more preferably 35 or 40 to 110 | from 20 to 160, preferably 30 to 130, more preferably 35 or 40 to 110 | from 20 to 160, preferably 30 to 130, more preferably 35 or 40 to 110 |
| second dielectric layer | from 20 to 160, preferably 30 to 130, more preferably 40 to 110 | from 40 to 220, preferably 60 to 200, more preferably 90 or 110 to 190 | from 40 to 220, preferably 60 to 200, more preferably 90 or 110 to 190 |
| third dielectric layer | — | from 20 to 160, preferably 30 to 130, more preferably 40 to 110, still more preferably 35 to 90 | from 40 to 220, preferably 60 to 200, more preferably 90 or 110 to 190 |
| fourth dielectric layer | — | — | from 20 to 160, preferably 30 to 130, more preferably 35 or 40 to 110 |

In some embodiments, the last, uppermost dielectric layer comprises a protective topcoat, which is the last layer of the stack. It preferably consists of an oxide or a substoichiometric oxide comprising at least one element selected from Ti and Zr; preferably it consists of a titanium-zirconium mixed oxide, for example in a weight ratio Ti/Zr of around 65/35. Such a layer may improve the chemical and/or mechanical durability of the glazing. This protective topcoat advantageously has a thickness of at least 2 nm, preferably at least 3 nm; preferably its thickness is at most 20 nm, at most 15 nm or at most 12 nm, more preferably at most 10 nm or at most 9 nm.

In some embodiments of the invention, the stack of thin layers comprises at least, or consists of, starting from the substrate:
(i) a layer of zinc-tin mixed oxide, having a thickness between 27 and 45 nm,
(ii) a layer of zinc oxide, optionally doped with aluminium, having a thickness between 1 and 8 nm, in contact with layer (iii),
(iii) a silver-based functional layer, having a thickness between 7 and 16 nm,
(iv) a barrier layer of zinc oxide, optionally doped with aluminium, having a thickness between 1 and 32 nm, preferably between 1 and 18 nm, more preferably between 1 and 5 nm, in contact with layer (iii),
(v) a layer of zinc-tin mixed oxide or a layer based on zinc oxide, having a thickness between 15 and 35 nm,
(vi) a layer of silicon oxide, advantageously deposited by PECVD, having a thickness between 20 and 50 nm, preferably between 20 and 30 nm, and
(vii) optionally a layer of titanium-zirconium mixed oxide, having a thickness between 2 and 10 nm.

In other embodiments of the invention, the stack of thin layers comprises at least, or consists of, starting from the substrate:
(i) a layer of titanium oxide, having a thickness between 25 and 35 nm,
(ii) a layer of zinc oxide, optionally doped with aluminium, having a thickness between 1 and 8 nm, in contact with layer (iii),
(iii) a silver-based functional layer, having a thickness between 10 and 16 nm,
(iv) a barrier layer of zinc oxide, optionally doped with aluminium, having a thickness between 1 and 18 nm, preferably between 1 and 5 nm, in contact with layer (iii),
(v) a layer of titanium oxide, having a thickness between 5 and 35 nm,
(vi) optionally a layer of zinc-tin mixed oxide,
(vii) optionally a layer of silicon nitride, layer (vi), in the absence of layer (vii), having a thickness of at most 35 nm, or layer (vii), in the absence of layer (vi), having a thickness of at most 35 nm, or layers (vi) and (vii) having together a thickness of at most 35 nm,
(viii) a layer of silicon oxide, advantageously deposited by PECVD, having a thickness of at most 45 nm, with a total thickness for layer (vi), if any, and layer (vii) of between 20 and 45 nm, and (ix) optionally a layer of titanium-zirconium mixed oxide, having a thickness between 2 and 10 nm.

In further embodiments of the invention, the stack of thin layers comprises at least, or consists of, starting from the substrate:
(i) a layer of zinc-tin mixed oxide, having a thickness between 27 and 45 nm,
(ii) a layer of zinc oxide, optionally doped with aluminium, having a thickness between 1 and 8 nm, in contact with layer (iii),
(iii) a silver-based functional layer, having a thickness between 7 and 16 nm,
(iv) a barrier layer of zinc oxide, optionally doped with aluminium, having a thickness between 1 and 35 nm, preferably between 1 and 18 nm, in contact with layer (iii),
(v) a layer of silicon oxide, advantageously deposited by PECVD, having a thickness between 20 and 100 nm, preferably between 20 and 80 nm, and
(vi) optionally a layer of titanium-zirconium mixed oxide, having a thickness between 2 and 10 nm.

In still further embodiments of the invention, the stack of thin layers comprises at least, or consists of, starting from the substrate:
(i) a layer of zinc-tin mixed oxide, having a thickness between 27 and 45 nm,
(ii) a layer of zinc oxide, optionally doped with aluminium, having a thickness between 1 and 8 nm, in contact with layer (iii),
(iii) a silver-based functional layer, having a thickness between 7 and 16 nm,
(iv) a barrier layer of zinc oxide, optionally doped with aluminium, having a thickness between 1 and 18 nm, preferably between 1 and 8 nm, in contact with layer (iii),
(v) optionally a layer of zinc-tin mixed oxide or a layer based on zinc oxide, having a thickness between 5 and 20 nm,
(vi) a layer of silicon oxide, advantageously deposited by PECVD, having a thickness between 20 and 125 nm, preferably between 20 and 100 nm,
(vii) a layer of zinc oxide, optionally doped with aluminium, having a thickness between 1 and 8 nm, in contact with layer (viii),
(viii) a silver-based functional layer, having a thickness between 7 and 16 nm,
(ix) a barrier layer of zinc oxide, optionally doped with aluminium, having a thickness between 1 and 18 nm, preferably between 1 and 8 nm, in contact with layer (viii),
(x) a layer of zinc-tin mixed oxide or/and a layer based on zinc oxide, having a thickness, if appropriate together, of between 10 and 70 nm, and
(xi) optionally a layer of titanium-zirconium mixed oxide, having a thickness between 2 and 10 nm.

Advantageously, to minimise or avoid haze due to recrystallisation when a thick SiO2 layer is used, such layer may be split into two layers separated by another dielectric material like a layer of zinc-tin mixed oxide or a layer based on zinc oxide. In the preceding embodiment, this could give, for example, the following sequence: . . . (iv)-(v)-(vi)-(v)-(vi)-(vii) . . . .

In still other embodiments of the invention, the stack of thin layers comprises at least, or consists of, starting from the substrate:
(i) a layer of zinc-tin mixed oxide, having a thickness between 27 and 45 nm,
(ii) a layer of zinc oxide, optionally doped with aluminium, having a thickness between 1 and 8 nm, in contact with layer (iii),
(iii) a silver-based functional layer, having a thickness between 7 and 16 nm,
(iv) a barrier layer of zinc oxide, optionally doped with aluminium, having a thickness between 1 and 18 nm, preferably between 1 and 8 nm, in contact with layer (iii),
(v) a layer of zinc-tin mixed oxide or/and a layer based on zinc oxide, having a thickness, if appropriate together, of between 10 and 70 nm,
(vi) a layer of zinc oxide, optionally doped with aluminium, having a thickness between 1 and 8 nm, in contact with layer (vii),
(vii) a silver-based functional layer, having a thickness between 7 and 16 nm,
(viii) a barrier layer of zinc oxide, optionally doped with aluminium, having a thickness between 1 and 18 nm, preferably between 1 and 8 nm, in contact with layer (vii),
(ix) optionally a layer of zinc-tin mixed oxide or a layer based on zinc oxide, having a thickness between 5 and 20 nm,
(x) a layer of silicon oxide, advantageously deposited by PECVD, having a thickness between 10 and 125 nm, preferably between 20 and 100 nm, and
(xi) optionally a layer of titanium-zirconium mixed oxide, having a thickness between 2 and 10 nm.

Glazing panels according to the invention are preferably used in multiple glazing, for example as double or triple glazing. They may advantageously show the following properties:

| single functional layer configuration stack | Single glazing (SG) 4 mm clear glass | Double glazing (DG) 90% Ar, coating in position 3, paired with a clear glass of 4 mm |
|---|---|---|
| LT before \| after heat treatment | ≥73%, ≥75%, ≥85% | ≥65%, ≥75%, ≥78% |
| LRc before \| after heat treatment | ≤25%, ≤18%, ≤12% | — |
| LRg before \| after heat treatment | ≤25%, ≤18%, ≤12% | — |
| ET before \| after heat treatment | ≥50%, ≥55%, ≥58%, ≥60% | — |
| ERc before \| after heat treatment | ≤40%, ≤35%, ≤33% | — |
| ERg before \| after heat treatment | ≤34%, ≤30%, ≤27% | — |
| ΔLT, ΔLRc, ΔLRg, $\Delta E^*_T$, $\Delta E^*_{Rc}$, $\Delta E^*_{Rg}$ before \| after heat treatment | ≤5, ≤3, ≤2 | ≤5, ≤3, ≤2 |
| Rs before \| after heat treatment | between 2 and 7 Ω/□, between 1.5 and 4 Ω/□ | — |

-continued

| single functional layer configuration stack | Single glazing (SG) 4 mm clear glass | Double glazing (DG) 90% Ar, coating in position 3, paired with a clear glass of 4 mm |
|---|---|---|
| $\Delta Rs^2$ before/after heat treatment | ≤3.0, ≤2.0, ≤1.5 | — |
| g before | after heat treatment | — | between 55% and 75%, preferably between 58% and 65% |
| $\Delta$g before | after heat treatment | — | ≤5, ≤3, ≤2 |
| Colour in transmission a* before | after heat treatment b* | between −5 & 5 between −6 & +6 | |
| Colour in reflection coating side a* before | after heat treatment b* | between −4 & +4 between −18 & +2 | |
| Colour in reflection glass side a* before | after heat treatment b* | between −4 & +4 between −18 & +2 | |
| Emissivity | <0.060, <0.050, <0.045, <0.035 | |

| double functional layer configuration stack | Single glazing (SG) 4 mm clear glass | Double glazing (DG) 90% Ar, coating in position 3, paired with a clear glass of 4 mm |
|---|---|---|
| LT before | after heat treatment | — | ≥55, ≥60%, ≥65% |
| LRc before | after heat treatment | ≤25%, ≤20%, ≤15% | — |
| LRg before | after heat treatment | ≤25%, ≤20%, ≤15% | — |
| ET before | after heat treatment | <55%, <50%, <45% | — |
| $\Delta$LT, $\Delta$LRc, $\Delta$LRg, $\Delta E^*_T$, $\Delta E^*_{Rc}$, $\Delta E^*_{Rg}$ before | after heat treatment | ≤5, ≤3, ≤2 | — |
| Rs before | after heat treatment | between 0.8 and 3.5 $\Omega/\square$, between 1.3 and 3 $\Omega/\square$ | — |
| g before | after heat treatment | — | ≤41% |
| $\Delta$g before | after heat treatment | — | ≤5%, ≤3%, ≤2% |
| Selectivity | | ≥1.75 |
| Colour in transmission a* before | after heat treatment b* | between −5 and 5 between −6 and +6 | |
| Colour in reflection glass side a* | between −7 and +7, between −4 and +4 | |
| before | after heat treatment b* | between −20 and +2, between −15 and −3 | |
| Emissivity | <0.045, <0.035, <0.025 | |

According to some embodiments of the invention, the coating stack is "self-matchable". This means there is no or only few change in the optical and/or energetical properties, when the coated substrate undergoes a heat treatment of the type tempering or bending. This has for advantage that non heat treated and heat treated products can be placed next to each other for the same application, e.g. within a building facade. Previously, it was on the contrary necessary to develop and manufacture in parallel two types of coating stacks, one for non-tempered glass, the other for glass to be tempered or bent, which is complicated both in terms of research and development efforts and in terms of logistics, inter alia.

According to another of its aspects, the present invention provides a process of coating a transparent substrate with a stack of thin layers as defined by claim 16. Dependent claims define preferred and/or alternative aspects of the invention.

The invention provides in this respect a process of coating a transparent substrate with a stack of thin layers comprising n functional layer(s) reflecting infrared radiation and n+1 dielectric layers, with n≥1, each functional layer being surrounded by dielectric layers. Such process comprises depositing a layer consisting essentially of silicon oxide by plasma enhanced chemical vapour deposition (PECVD) as part of at least one dielectric layer above a functional layer and depositing a barrier layer based on zinc oxide above and in direct contact with any functional layer which has a silicon oxide layer in the dielectric directly above it.

Plasma enhanced chemical vapour deposition (PECVD) is a process commonly used to deposit thin films from a gas state (vapour) to a solid state on a substrate. Chemical reactions are involved in the process, which occur after creation of a plasma of the reacting gases. PECVD can be carried out using any plasma: non-thermal plasmas (out of equilibrium) or thermal plasmas (in equilibrium). Non-thermal plasmas are generally preferred. The active entities of the plasma, such as electrons, ions or radicals, can bring about the dissociation or the activation of the chemical precursors. In order to keep the plasma out of equilibrium, it is often necessary to operate at reduced pressure. The majority of the known PECVD techniques thus use low-pressure plasmas. Preferably deposition of the layer consisting essentially of silicon oxide according to the invention is made by low-pressure PECVD.

The plasma can be generated via sources employing known devices which are commercially available. Mention may be made, as plasma sources, of PBS (Plasma Beam Source) sources, PDP (Penning Discharge Plasma) sources, microwave sources and ICP (Inductively Coupled Plasma) sources. Within the PBS sources, mention may be made of hollow-cathode plasma sources (see, for example, WO2010/017185) and linear dual beam plasma sources (Dual Beam PBS™) originating in particular from GPi (General Plasma Inc.). In comparison with magnetron sputtering, PECVD gives access to plasmas having lower temperatures, which makes possible the deposition of many more different materials.

Preferably, deposition of the layer consisting essentially of silicon oxide is made by PECVD using a microwave source, a hollow cathode source or a dual beam plasma source. Deposition of the thin layers of the stack other than the layer consisting essentially of silicon oxide is preferably made by magnetron sputtering. Advantageously, both processes, PECVD and magnetron sputtering, can be integrated on a same line of production, the PECVD source being placed in a coat zone of the magnetron coater.

Precursors of silicon that can be used in the PECVD process according to the invention are silanes, disilanes, siloxanes amongst which TMDSO (tetramethyldisiloxane) and HMDSO (hexamethyldisiloxane) are preferred, silazanes, silylamines amongst which TSA (trisilylamine) is preferred, silicon alkoxides amongst which TEOS (tetraethyl orthosilicate) is preferred, and silanols. Silane, TMDSO, HMDSO and TSA are preferred.

Embodiments of the invention will now be further described, by way of example only, with reference to examples 1 to 10, along with comparative examples 1 to 15. All the thickness values of the examples and comparative examples are given in nm. Except otherwise stated, the silicon oxide layers have been deposited by PECVD. Some with a hollow cathode source, of the type described in WO2010/017185 in a configuration of 1 meter width, under the following conditions: 20 kW AC, TSA precursor flow around 95 sccm from a central feed, recorded dynamic deposition rate of 300 nm/m$_{/min}$. Others with a microwave source, under the following conditions: 3 kW, 120 sccm HMDSO precursor, 1000 sccm 02, dynamic deposition rate of 60 nm/m$_{/min}$.

In the following tables, the following abbreviations are used:

ZnSnOx zinc-tin mixed oxide
ZSO5 zinc-tin mixed oxide with a zinc-tin proportion of around 52-48 Wt. %
ZnO:Al aluminium doped zinc oxide, deposited from a metallic target in oxygen atmosphere
AZO aluminium doped zinc oxide, deposited from a ceramic target in neutral atmosphere
AlSiN aluminium-silicon mixed nitride
ZnSnOx:Al aluminium doped zinc-tin mixed oxide
TiOx substoichiometric oxide of titanium
AlN aluminium nitride
SiN silicon nitride

COMPARATIVE EXAMPLE 1

The following stack of thin layers, not in accordance with the invention, has been deposited by magnetron sputtering on a glass substrate:

| glass | | | | |
|---|---|---|---|---|
| ZnSnO$_x$ | ZnO | Ag | ZnO:Al (2 Wt. %) | ZnSnO$_x$ |
| 32 | 5 | 13.3 | 15 | 41 |

It corresponds to a coating stack according to the teaching of EP1140721. It shows a sheet resistance, before and after heat treatment, respectively of 3.34Ω/□ et 3.80Ω/□. Under examination with the naked eye, the heat-treated product shows inacceptable haze and spots.

Compared to example 9, this demonstrates the advantage of having a silicon oxide layer in the second dielectric layer to minimise or avoid haze and spots after heat treatment.

COMPARATIVE EXAMPLES 2 AND 3

The following stacks of thin layers, not in accordance with the invention, have been deposited by magnetron sputtering on a glass substrate:

| glass | | | | | | | | |
|---|---|---|---|---|---|---|---|---|
| AlSiN | ZnSnO$_x$:Al | TiO$_x$ | ZnO:Al | Ag | ZnSnO$_x$:Al | ZnO | AlN | ZnSnO$_x$ |
| c. ex. 2 | | | | | | | | |
| 43 | 4 | 0.9 | 7.7 | 8 | 7.7 | 1.3 | 50 | 12 |

| glass | | | | | | | | | |
|---|---|---|---|---|---|---|---|---|---|
| AlSiN | ZnSnO$_x$:Al | TiO$_x$ | ZnO:Al | Ag | ZnSnO$_x$:Al | ZnO | AlN | ZnSnO$_x$ | SiN |
| c. ex. 3 | | | | | | | | | |
| 43 | 4 | 0.9 | 7.7 | 8 | 7.7 | 1.3 | 50 | 12 | 20 |

Before any heat treatment, they undergo a Cleveland test to measure their chemical durability. Results are bad: already after one day, discolouration is visible with the naked eye, and after 3 days, it is even more visible.

By comparison, examples according to the present invention do not show any discolouration visible with the naked eye, after one day, nor 3 days, of Cleveland test. This demonstrates the advantage of having preferably and inter alia, a layer of an oxide in direct contact with the substrate, for a better chemical durability of the non heat-treated product.

COMPARATIVE EXAMPLES 4 TO 9

Single silver and double silver coating stacks according to Table I, including a metallic titanium barrier, have been deposited on a glass substrate of 3 mm thickness. Silicon oxide layers have been deposited by Hollow Cathode PECVD, whilst other layers of the stack have been deposited by magnetron sputtering. These are coating stacks not in accordance with the invention.

The score of Brush test (AB Brush), haze (AB Haze), emissivity (AB E) and sheet resistance (AB Rs [Ω/□]) on heat-treated samples (heat treatment was carried out at 730° C. during 3 min 15 s for single silver stacks and 4 min for double silver stacks) are given in the table. All comparative examples show at least one value for these properties which is unacceptable (underlined values in the table). By comparing c.ex.4 and c.ex.5 or c.ex.6 and c.ex.7, it can be seen, for example, that slightly increasing the thickness of the Ti barrier(s) improves the Brush score, but increases the haze.

This shows that it is not possible to reach at the same time a low haze value and a good resistance to abrasion, for coating stacks incorporating a PECVD silicon oxide layer and having a metallic barrier layer.

Moreover, by comparing the colour in reflection of the coatings according to c.ex.6-9 before and after heat treatment, we have noted that such stacks are far from being self-matchable, with Delta E* of more than 10.

EXAMPLES 1 TO 5 AND COMPARATIVE
EXAMPLES 10 AND 11

Single silver coating stacks according to Table II have been deposited on a glass substrate of 3 mm thickness. Silicon oxide layers in the examples 1 to 5 according to the invention have been deposited by Hollow Cathode PECVD, whilst silicon oxide layers in the comparative examples 10 and 11 not in accordance with the invention have been deposited by magnetron sputtering. Other layers of the stacks have been deposited by magnetron sputtering.

The score of Brush test (AB Brush), haze (AB Haze), emissivity (AB E) and sheet resistance (AB Rs [Ω/□]) on heat-treated samples (heat treatment was carried out at 730° C. during 3 min 15 s) are given in the table, together with the Delta E* value in reflection on the coating side.

All the examples according to the invention show good results in terms of resistance to abrasion, haze, emissivity and sheet resistance after heat treatment. They furthermore show good results in terms of self-matchability, with Delta E* of less than 5.0, preferably less than 3.0, more preferably less than 2.0. On the contrary, samples incorporating silicon oxide deposited by magnetron show at least one value for these properties which is unacceptable (underlined values in the table).

In addition, the following properties were measured on example 1:

|  | Single glazing (SG) |
|---|---|
| LT before \| after heat treatment | 86.5% \| 90.4% |
| LRc before \| after heat treatment | 4.7% \| 4.9% |
| LRg before \| after heat treatment | 5.1% \| 5.2% |
| Rs before \| after heat treatment | 3.8 Ω/□ \| 3.4 Ω/□ |

EXAMPLES 6 TO 8 AND COMPARATIVE
EXAMPLES 12 AND 13

Double silver coating stacks according to Table III have been deposited on a glass substrate of 3 mm thickness. Silicon oxide layers in the examples 6 to 8 according to the invention have been deposited by Hollow Cathode PECVD, whilst silicon oxide layers in the comparative examples 12 and 13 not in accordance with the invention have been deposited by magnetron sputtering. Other layers of the stacks have been deposited by magnetron sputtering.

The score of Brush test (AB Brush), haze (AB Haze), emissivity (AB E) and sheet resistance (AB Rs [Ω/□]) on heat-treated samples (heat treatment was carried out at 730° C. during 4 min) are given in the table.

All the examples according to the invention show good results in terms of resistance to abrasion, haze, emissivity and sheet resistance after heat treatment. On the contrary, samples incorporating silicon oxide deposited by magnetron show at least one value for these properties which is unacceptable (underlined values in the table).

In addition, the following properties were measured on example 6:

|  | Single glazing (SG) |
|---|---|
| LT before \| after heat treatment | 73% \| 69.6% |
| LRc before \| after heat treatment | 6.8% \| 6.4% |
| LRg before \| after heat treatment | 9% \| 11.1% |
| Rs before \| after heat treatment | 2.8 Ω/□ \| 2.4 Ω/□ |

TABLE I

|  | ZSO5 | ZnO:Al | Ag | Ti | ZnO:Al | SiO2 | AB Brush | AB Haze | AB E | AB Rs |
|---|---|---|---|---|---|---|---|---|---|---|
| c. ex. 4 | 31.9 | 5 | 8.5 | 2.2 | 27 | 25.9 | <u>5</u> | 0.99 | <u>0.14</u> | <u>4.7</u> |
| c. ex. 5 | 42.6 | 6.7 | 8.5 | 2.4 | 29.7 | 31.4 | 2 | <u>1.13</u> | <u>0.13</u> | <u>5.2</u> |

|  | ZSO5 | ZnO:Al | Ag | Ti | SiO2 | ZnO:Al | Ag | Ti | ZnO:Al | SiO2 | AB Brush | AB Haze | AB E | AB Rs |
|---|---|---|---|---|---|---|---|---|---|---|---|---|---|---|
| c. ex. 6 | 30 | 5 | 9 | 1.8 | 90 | 20 | 10 | 2 | — | 30 | <u>5</u> | <u>1.17</u> | 0.06 | 2.2 |
| c. ex. 7 | 30 | 5 | 9 | 3 | 90 | 20 | 10 | 3 | — | 30 | 1 | <u>2.50</u> | <u>0.08</u> | 2.2 |
| c. ex. 8 | 30 | 5 | 9 | 2 | 90 | 20 | 10 | 2.5 | 20 | 20 | <u>5</u> | <u>1.67</u> | 0.06 | 2.0 |
| c. ex. 9 | 30 | 5 | 9 | 1.8 | 90 | 20 | 10 | 2.2 | 20 | 20 | <u>5</u> | 0.49 | 0.06 | 2.1 |

TABLE II

|  | ZSO5 | ZnO:Al | Ag | AZO | ZnO:Al | SiO2 | AB Brush | AB Haze | AB E | AB Rs | Delta E* |
|---|---|---|---|---|---|---|---|---|---|---|---|
| ex. 1 | 32 | 5 | 8.5 | 15 | 17 | 26 | 1 | 0.11 | 0.08 | 3.4 | 1.4 |
| ex. 2 | 32 | 5 | 8.5 | 15 | 17 | 50 | 2 | 0.12 | 0.08 | 3.0 | 2.7 |
| c. ex. 10 | 32 | 5 | 8.5 | 15 | 17 | 26 | 4.5 | 0.47 | 0.09 | 3.6 | 5.0 |
| c. ex. 11 | 32 | 5 | 8.5 | 15 | 17 | 50 | 4.5 | 0.25 | 0.08 | 3.4 | 8.3 |

|  | ZSO5 | ZnO:Al | Ag | AZO | SiO2 | AB Brush | AB Haze | AB E | AB Rs | Delta E* |
|---|---|---|---|---|---|---|---|---|---|---|
| ex. 3 | 32 | 5 | 8.5 | 32 | 26 | 2 | 0.13 | 0.10 | 3.4 | 2.1 |
| ex. 4 | 32 | 5 | 8.5 | 15 | 75 | 2.25 | 0.21 | 0.08 | 3.2 | 0.9 |
| ex. 5 | 32 | 5 | 8.5 | 15 | 100 | 2 | 0.27 | 0.10 | 3.2 | 2.7 |

TABLE III

|  | ZSO5 | ZnO:Al | Ag | AZO | ZnO:Al | SiO2 | ZnO:Al | Ag | AZO | ZnO:Al | ZSO5 | AB Brush | AB Haze | AB E | AB Rs |
|---|---|---|---|---|---|---|---|---|---|---|---|---|---|---|---|
| ex. 6 | 30 | 5 | 8.5 | 15 | 15 | 75 | 20 | 10 | 5 | 19 | 19 | 2.25 | 0.10 | 0.06 | 2.4 |
| ex. 7 | 30 | 5 | 8.5 | 5 | 10 | 125 | 10 | 10 | 5 | 19 | 19 | 2 | 0.28 | 0.09 | 3.0 |
| c. ex. 12 | 30 | 5 | 8.5 | 15 | 15 | 75 | 20 | 10 | 5 | 19 | 19 | 4.5 | 1.09 | 0.03 | 3.1 |
| c. ex. 13 | 30 | 5 | 8.5 | 7.5 | — | 125 | 20 | 10 | 5 | 19 | 19 | 4.75 | 0.57 | 0.07 | 3.5 |

|  | ZSO5 | ZnO:Al | Ag | AZO | ZnO:Al | SiO2 | ZnO:Al | Ag | AZO | ZnO:Al | SiO2 | AB Brush | AB Haze | AB E | AB Rs |
|---|---|---|---|---|---|---|---|---|---|---|---|---|---|---|---|
| ex. 8 | 30 | 5 | 8.5 | 15 | 15 | 75 | 20 | 10 | 15 | 17 | 50 | 2.25 | 0.37 | 0.06 | 2.2 |

EXAMPLE 9

The following stacks of thin layers, in accordance with the invention, has been deposited on a glass substrate of 4 mm thickness:

| glass | | | | | |
|---|---|---|---|---|---|
| ZSO5 | ZnO:Al (2 Wt. %) | Ag | AZO | ZSO5 | SiO2 |
| 42.5 | 3 | 7.9 | 3 | 32 | 20 |

All the coatings have been deposited by magnetron sputtering, except the silicon oxide layer which has been deposited by microwave PECVD.

The following properties were measured on example 9, before and after a heat treatment of 700° C. during 4 min. Moreover, under examination with the naked eye, the heat-treated product has showed no inacceptable haze or spots.

| | Single glazing (SG) |
|---|---|
| LT before | after heat treatment | 89.8% | 89.7% |
| ☐ before | after heat treatment | 0.08 | 0.07 |
| Colour in transmission L* | 95.9 | 95.8 |
| before | after heat treatment a* | −1.1 | −0.8 |
| b* | 0.8 | 0.6 |
| Colour in reflection coating side L* | 24.8 | 26.5 |
| before | after heat treatment a* | −0.7 | −1.8 |
| b* | −0.4 | −0.1 |
| Colour in reflection glass side L* | 26.5 | 27.4 |
| before | after heat treatment a* | −1.1 | −1.9 |
| b* | −2.9 | −3.1 |

COMPARATIVE EXAMPLE 14

A similar stack to example 9, but without SiO2 and thus not in accordance with the invention, has been deposited on a glass substrate of 4 mm thickness, by magnetron sputtering:

| glass | | | | |
|---|---|---|---|---|
| ZSO5 | ZnO:Al (2 Wt. %) | Ag | AZO | ZSO5 |
| 40 | 3 | 7.5 | 3 | 38.3 |

Performances to various tests (described hereunder) were compared between example 9 and comparative example 14, showing the advantageous effect of the PECVD SiO2 topcoat on coating hardness:

| | Before heat-treatment | | After heat-treatment | |
|---|---|---|---|---|
| | C. Ex. 14 | Ex. 9 | C. Ex. 14 | Ex. 9 |
| Washing test 1 | 1 | 1 | — | — |
| Washing test 2 | 6 | 1 | — | — |
| Taber test (dry) | 6 | 2 | 2 | 1 |
| Taber test (wet) | 6 | 3 | 3 | 1 |

EXAMPLE 10

The following stacks of thin layers, in accordance with the invention, has been deposited on a glass substrate of 4 mm thickness:

| glass | | | | | |
|---|---|---|---|---|---|
| TiO2 | ZnO:Al (2 Wt. %) | Ag | AZO | TiO2 | SiO2 |
| 26.5 | 3 | 13.2 | 2 | 25 | 28 |

All the coatings have been deposited by magnetron sputtering, except the silicon oxide layer which has been deposited by microwave PECVD.

COMPARATIVE EXAMPLE 15

A similar stack to example 10, but without SiO2 and thus not in accordance with the invention, has been deposited on a glass substrate of 4 mm thickness, by magnetron sputtering:

| glass | | | | | |
|---|---|---|---|---|---|
| TiO2 | ZnO:Al (2 Wt. %) | Ag | AZO | TiO2 | ZSO5 |
| 29.3 | 3 | 12.8 | 2 | 20 | 17 |

Performances to AWRT test (described hereunder) were compared between example 10 and comparative example 15, showing again the advantageous effect of the PECVD SiO2 topcoat on coating hardness:

|  | C. Ex. 15 | Ex. 10 |
|---|---|---|
| AWRT (250) | 7 | 8 |
| AWRT (500) | 5 | 9 |

Finally samples according to example 10 and comparative example 15 were immersed into solutions of various pH during 5 minutes then dried. Colour was measured before and after immersion and drying, and a colour change ☐E* was calculated, showing the advantageous effect of the PECVD SiO2 topcoat on coating chemical resistance:

|  | ☐E* C. Ex. 15 | ☐E* Ex. 10 |
|---|---|---|
| pH 2 | 2.1 | 0.1 |
| pH 3.4 | 1.6 | 0.1 |
| pH 5 | 0.4 | 0.1 |
| pH 8 | 0.5 | 0.1 |
| pH 12 | 0.7 | 0.1 |

Brush Test

The "Brush test" or "Wet Brush test" is used to evaluate the resistance of the coating to erosion caused by scrubbing. Full details of this test are set out in ASTM Standard D 2486-00. Samples of coated glass were submitted to Test Method A. The samples were scrubbed wet (with demineralized water), with a bristle brush, during 1000 cycles. Their degradation was then observed with the naked eye and compared. A score was assigned between 1 and 5, 1 meaning not degraded and 5 meaning very much degraded (entire coating removal).

Washing Test

The "Washing test" is used to evaluate the resistance of the coating to erosion caused by washing. A 40×50 cm square sample is introduced into an industrial glass washing machine operating with demineralised water. While the sample is in contact with the rotating brushes, the forward movement is stopped for 60 s. In test 1, the brushes are switched off at the same time while in test 2 they continue rotating. In both cases the water keeps on running.

The degradation is observed with the naked eye and compared. A score is assigned between 1 and 6, 1 meaning not degraded and 6 meaning very much degraded (entire coating removal).

Taber Test

The "Taber test" is another test used to evaluate the resistance of the coating to erosion caused by friction. A 10×10 cm square sample is maintained on a steel plate rotating at a speed of 65 to 75 rpm. Each of two parallel weighted arms carries one specific abrasive small wheel rotating freely around a horizontal axis. The wheels are covered by a felt stripe (according to DIN 68861, supplied by Erichsen, attached to the wheels). Each wheel lies on the sample to be tested under the weight applied to each arm, which is a mass of 500 g. The samples may be scrubbed wet (with demineralized water) or dry. The combination of the abrasive wheels and the rotating supporting plate creates on the sample an abrasive crown, more or less pronounced according to the coating hardness. A score of 1 to 6 is given to each sample having being subjected to the test after a total of 500 rotations, 1 being the best score showing a highly resistant coating and 6 being the lowest score.

AWRT

The "Automatic Web Rub Test" (AWRT) is again a test used to evaluate the resistance of the coating to erosion. A piston covered with a cotton cloth (reference: CODE 40700004 supplied by ADSOL) is put in contact with the coating and oscillates over the surface. The piston carries a weight in order to have a force of 33N acting on a 17 mm diameter finger. The abrasion of the cotton over the coated surface will damage (remove) the coating after a certain number of cycles. The test is realised for 250 and 500 cycles, at separated distances over the sample. The sample is observed under an artificial sky to determine whether discoloration and/or scratches can be seen on the sample. The AWRT score is given on a scale from 1 to 10, 10 being the best score, indicating a highly resistant coating

What is claimed is:

1. A process of coating a transparent substrate with a stack of layers comprising n functional layer(s) reflecting infrared radiation and n+1 dielectric layers, with n≥1, each functional layer being surrounded by dielectric layers, comprising:
    depositing a layer consisting essentially of silicon oxide by plasma enhanced chemical vapour deposition (PECVD) as part of at least one dielectric layer above a functional layer and
    depositing a barrier layer based on zinc oxide above and in direct contact with any functional layer which has a silicon oxide layer in the dielectric directly above it.

2. The process according to claim 1, wherein the depositing of the layer consisting essentially of silicon oxide is made by low-pressure PECVD.

3. The process according to claim 1, wherein the depositing of the layer consisting essentially of silicon oxide is made by PECVD using a microwave source, a hollow cathode source or a dual beam plasma source.

4. The process according to claim 1, further comprising: depositing of layers of the stack other than the layer consisting essentially of silicon oxide by magnetron sputtering.

5. The process according to claim 1, wherein the layer consisting essentially of silicon oxide has a thickness of more than 10 nm.

6. The process according to claim 1, further comprising: depositing a barrier layer based on zinc oxide above and in direct contact with each functional layer.

7. The process according to claim 1, wherein the barrier layer(s) consists (consist) of zinc oxide, optionally doped with aluminium.

8. The process according to claim 1, wherein the barrier layer(s) has (have) a thickness of at most 35 nm.

9. The process according to claim 1, further comprising: depositing directly on the substrate a first dielectric layer comprising an oxide.

10. The process according to claim 9, wherein the dielectric layer comprising an oxide which is deposited directly on the substrate is a layer of zinc-tin mixed oxide or a layer of titanium oxide.

11. The process according to claim 9, wherein the dielectric layer comprising an oxide which is deposited directly on the substrate has a thickness of at least 10 nm.

12. The process according to claim 1, wherein the functional layer(s) reflecting infrared radiation is a (are) silver-based layer(s).

13. The process according to claim 1, wherein each dielectric layer under a functional layer comprises a layer based on zinc oxide, directly in contact with said functional layer.

14. The process according to claim 13, wherein the layer based on zinc oxide under a functional layer has a thickness of at most 15 nm.

15. The process according to claim 13, wherein the layer based on zinc oxide has a thickness of between 1 and 10 nm.

16. The process according to claim 1, wherein at least one dielectric layer above a functional layer comprises, between a barrier layer based on zinc oxide and a layer consisting essentially of silicon oxide, at least one layer of a metal oxide different from the barrier layer and from the layer consisting essentially of silicon oxide.

17. The process according to claim 1, further comprising: depositing a last dielectric layer between a barrier layer based on zinc oxide and a layer consisting essentially of silicon oxide, the last dielectric layer comprising at least one layer of zinc-tin mixed oxide or of titanium oxide.

18. The process according to claim 1, wherein the layer consisting essentially of silicon oxide has an extinction coefficient at a wavelength of 632 nm below 1E-4, a refractive index of at least 1.466 and a carbon content of at most 3%.

19. The process according to claim 1, wherein the barrier layer(s) has (have) a thickness of between 1 and 25 nm.

20. The process according to claim 1, wherein the depositing of the layer consisting essentially of silicon oxide is made by PECVD using a hollow cathode source.

* * * * *